United States Patent [19]

Ishimura et al.

[11] Patent Number: 4,992,922
[45] Date of Patent: Feb. 12, 1991

[54] VARIABLE HIGH-VOLTAGE GENERATING CIRCUIT

[75] Inventors: Katsuhiro Ishimura; Shusei Aoki, both of Tokyo, Japan

[73] Assignee: Oki Electric Industry Co., Ltd., Tokyo, Japan

[21] Appl. No.: 392,293

[22] Filed: Aug. 11, 1989

Related U.S. Application Data

[63] Continuation-in-part of Ser. No. 298,024, Jan. 18, 1989, abandoned.

[30] Foreign Application Priority Data

Jan. 20, 1988 [JP] Japan .................................. 63-8381

[51] Int. Cl.⁵ ............................................. H02M 7/26
[52] U.S. Cl. ...................................... 363/59; 307/110; 250/214 AG; 323/293
[58] Field of Search .............................. 363/59, 60, 61; 307/110, 360, 362; 250/214 AG; 323/293, 295-298

[56] References Cited

U.S. PATENT DOCUMENTS

| | | | |
|---|---|---|---|
| 3,869,659 | 3/1975 | Doong et al. | 363/60 |
| 3,911,292 | 10/1975 | Petrick et al. | 363/60 X |
| 4,028,596 | 6/1977 | Weber | 363/60 X |
| 4,092,712 | 5/1978 | Harrigill, Jr. et al. | 363/60 |
| 4,236,199 | 11/1980 | Stewart | 363/60 |
| 4,495,410 | 1/1985 | Minami et al. | 250/214 AG X |

FOREIGN PATENT DOCUMENTS

7431358 11/1975 France .
55-162278 12/1980 Japan .

OTHER PUBLICATIONS

Manfred Märtens, "Eisenloser Spannungswandler", Radio Fernsenen Elektronix, 34, No. 4, (Apr. 1985), Ost-Berlin, DDR, pp. 263-264.

P. E. K. Donaldson, "The Mosmarx Voltage Multiplier," Electronics & Wireless World, vol. 94, No. 1630, (Aug., 1988), pp. 748-750.

"A High Voltage Power Supply for Optical Detector", Takahashi et al., Showa 61-nen Denshi Tsushin Gakkai Sogo Zenkoku Taikai Koen Ronbunshu (1986 General Meeting of the Institute of Electronics and Communication Engineers of Japan), Mar. 5th, 1986, paper No. 2485.

Primary Examiner—Steven L. Stephan
Assistant Examiner—Emanuel Todd Voeltz
Attorney, Agent, or Firm—Spencer & Frank

[57] ABSTRACT

In a variable high-voltage generating circuit for an avalanche photodiode, a pulse oscillating circuit generates pulses, a current driving circuit current-amplifies the pulses, a Cockcroft-Walton circuit boosts and rectifies the pulses from the current driving circuit, and a low-pass filter is connected at the output of the Cockcroft-Walton circuit. The avalanche photodiode is connected in series with a first resistor, and the series connection is connected to receive the output of the low-pass filter. A series connection of a transistor and a second resistor is connected in parallel with the series connection of the avalanche diode and the first resistor. A control circuit applies a variable signal to the base of the transistor, thereby to vary the voltage applied across the APD.

5 Claims, 2 Drawing Sheets

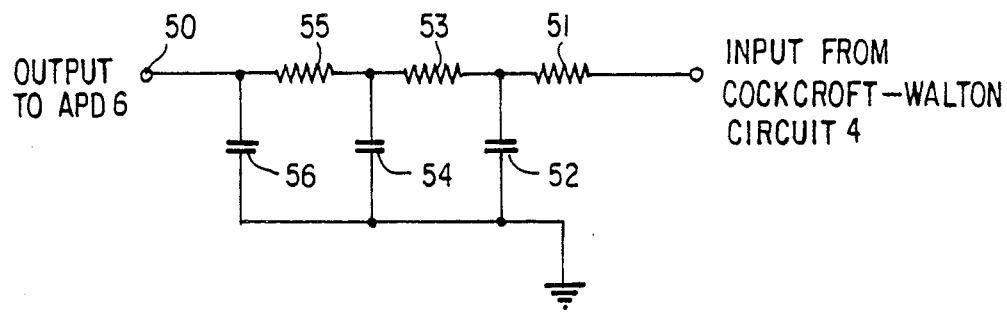
FIG. 1A
FIG. 2
PRIOR ART
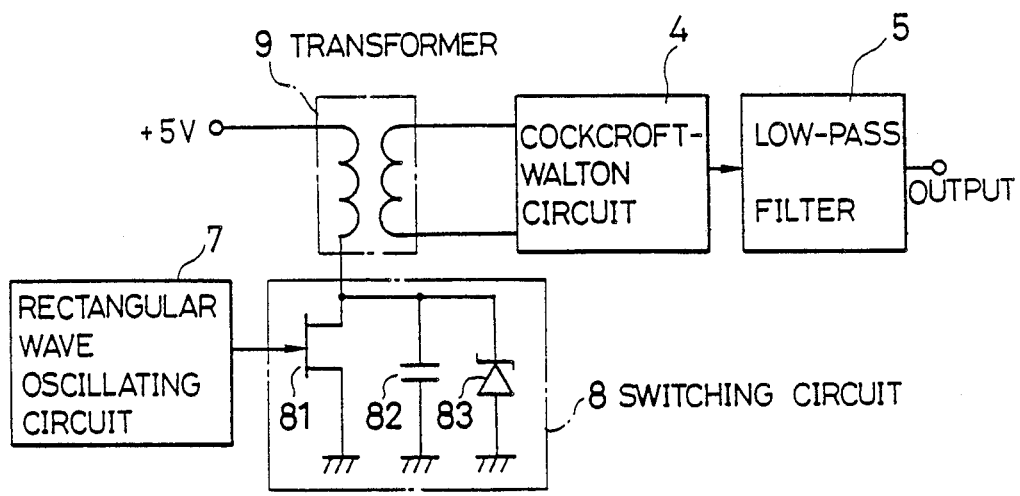

VARIABLE HIGH-VOLTAGE GENERATING CIRCUIT

CROSS REFERENCE TO RELATED APPLICATION

This is a continuation-in-part of our co-pending U.S. application Ser. No. 07/298,024, filed Jan. 18th, 1989 now abandoned.

BACKGROUND OF THE INVENTION

The present invention relates to a variable high-voltage generating circuit for a light-receiving element in a receiver circuit of an optical transmission device.

When an avalanche photodiode (APD) is used as the light-receiving element in the receiver circuit in an optical transmission device, a high-voltage generating circuit is required to induce an internal amplification function in the APD.

FIG. 2 shows an example of a prior art high-voltage generating circuit for a light receiving element (such as the high-voltage generating circuit shown in Showa 61-nen Denshi Tsushin Gakkai Sogo Zenkoku Taikai Koen Ronbunshu [1986 General Meeting of the Institute of Electronics and Communication Engineers of Japan], Mar. 5, 1986, Paper No. 2485). In FIG. 2, a rectangular wave generating circuit 7 produces pulses of about 100 kHz and outputs them through an internal CMOS invertor to a switching circuit 8. A MOSFET 81 in the switching circuit 8 performs switching responsive to the above-mentioned pulses and causes the production of pulses of a large amplitude in the primary side of a transformer 9, which resonates with a capacitor 82. A constant-voltage diode 83 is provided for stabilizing the output voltage. The pulses generated in the primary side of the transformer 9 are boosted by the transformer 9, and are further boosted and rectified by a Cockcroft-Walton Circuit 4, and are then passed through a low-pass filter 5 for removal of ripple components. The filtered voltage obtained at the output of the low-pass filter 5 is used as a high-voltage power supply for a light receiving element.

In the above high-voltage generating circuit, a MOSFET and a transformer are utilized, so that miniaturization of the circuit is difficult. Furthermore, the size of the transformer is difficult to reduce, and the transformer is not suitable for mounting on a plane.

SUMMARY OF THE INVENTION

An object of the invention is to remove the above shortcomings, and to provide a simplified variable high-voltage generating circuit of reduced size for light receiving element.

A variable high-voltage generating circuit according to the present invention comprise:
a pulse oscillating circuit for generating pulses;
a current driving circuit for current-amplifying the pulses;
a Cockcroft-Walton circuit for receiving the pulses from the current driving circuit, to provide a boosted and rectified voltage;
a low-pass filter connected at the output of the boosting and rectifying circuit for removing the ripple components of the output of the Cockcroft-Walton circuit;
the avalanche photodiode being connected in series with a resistor and the series connection being connected to receive the output of the low-pass filter;
a series connection of a transistor and a resistor, the series connection being connected in parallel with the series connection of the avalanche diode and the resistor; and
a control circuit applying a variable signal to the base of the transistor.

BRIEF DESCRIPTION OF THE DRAWINGS

FIG. 1A is a circuit diagram showing a modification of the low-pass filter used in the high-voltage generating circuit shown in FIG. 1.

FIG. 2 is a prior-art high-voltage generating circuit for an APD.

DETAILED DESCRIPTION OF THE EMBODIMENTS

Figure 1:
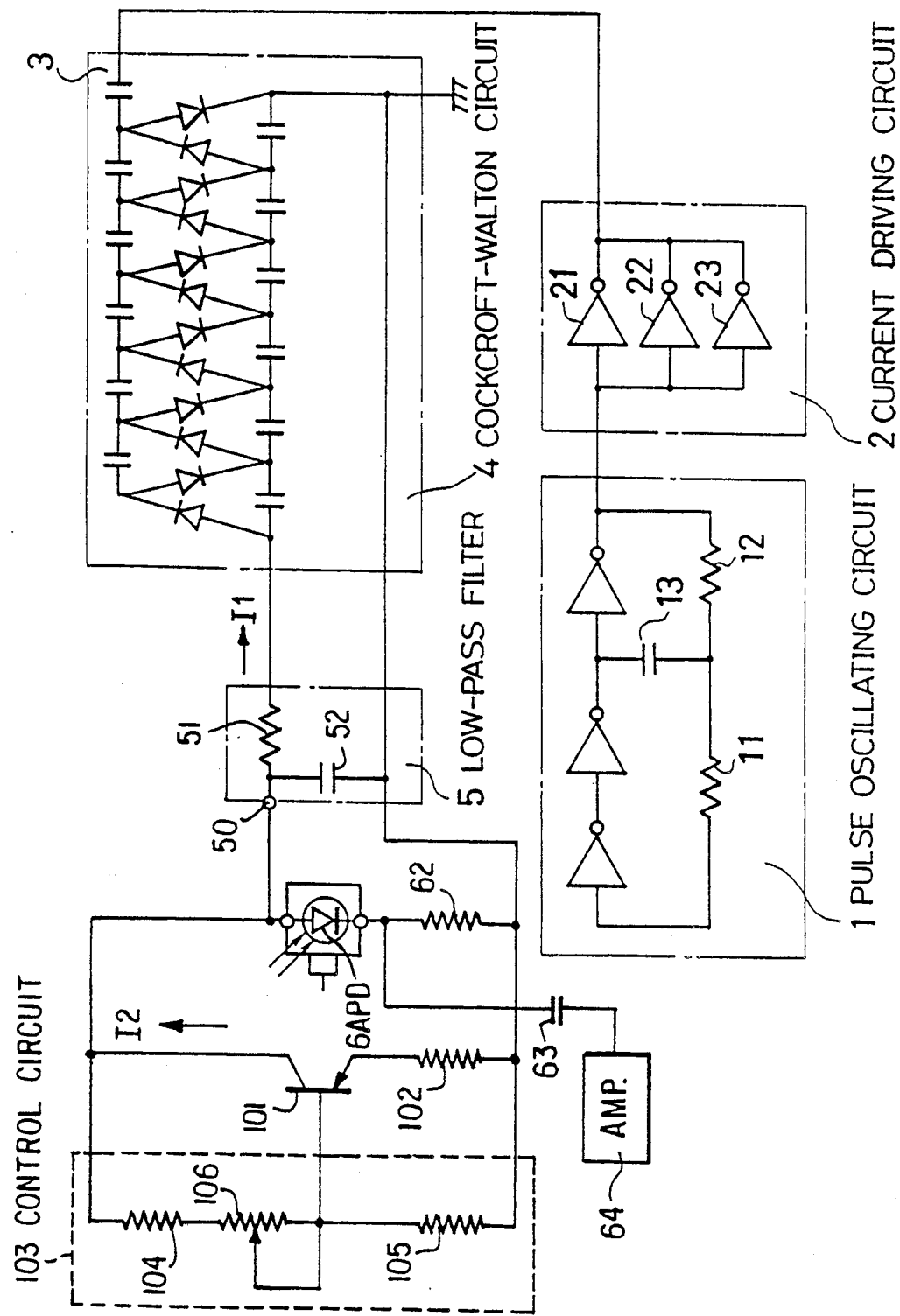
FIG. 1 is a block diagram showing a high-voltage generating circuit for an APD.

FIG. 1 is a circuit diagram showing an embodiment of the invention. The high-voltage generating circuit of this embodiment comprises a pulse oscillating circuit 1 utilizing CMOS gates, and a current driving circuit 2 having CMOS gates 21, 22, and 23 connected in parallel with each other. Each of the CMOS gates may comprise CMOS invertors cascaded with each other. A Cockcroft-Walton circuit 4 is connected to receive the output of the current driving circuit 2 through a capacitor 3 provided at one of its inputs. A low-pass filter 5 is provided at the output of the Cockcroft-Walton circuit 4. In the illustrated embodiment, the low-pass filter 5 comprises a resistor 51 connected between the output node of the Cockcroft-Walton circuit 4 and the output node 50 of the low-pass filter 5, and a capacitor 52 connected between the output node of the low-pass filter 5 and ground. As a modification, the low-pass filter may comprise combinations of resistors 51, 53 and 55 and capacitors 52, 54 and 56 cascaded with each other, as shown in FIG. 1A.

An avalanche photodiode (APD) 6 is connected to receive the output of the low-pass filter 5. More specifically, the anode of the APD 6 is connected to the output node 50 of the low-pass filter 5. The cathode of the APD 6 is connected through a resistor 62 to ground. The APD 6 is provided to receive light from a light source via a light transmission path (such as an optical fiber, not shown), and conducts an electric current corresponding to the intensity of the light it receives. The resistor 62 is connected in series with the APD 6, and the voltage across the resistor 62 is applied through a capacitor 63 to an amplifier 64 forming part of a light detector circuit. The APD 6 is used for detecting optical signals that have been transmitted and must be energized with a high voltage to attain an internal amplification function.

A PNP transistor 101 and a resistor 102 are connected in series with each other. More specifically, the emitter of the transistor 101 is connected through the resistor 102 to the ground while the collector of the transistor 101 is connected to the output node 50 of the low-pass filter 5. The base of the transistor 101 is connected to a control circuit 103 which controls the transistor 101.

The oscillating frequency of the oscillating circuit 1 is inversely proportional to the time constant determined by the product of the resistor 12 and the capacitor 13.

In FIG. 1, the pulses output from the pulse oscillating circuit 1 are current-amplified by the current driving circuit 2, and drive the Cockcroft-Walton circuit 4. The output stage of the pulse oscillating circuit 1 is a CMOS gate and the current drive capacity is limited, and if this output were used to drive the Cockcroft-Walton circuit 4 directly the high voltage required for the APD 6 would not be obtained at the output of the Cockcroft-Walton circuit 4. This is why the current driving circuit 2 is employed to enhance the current driving capacity. The Cockcroft-Walton circuit 4 is an example of a boosting and rectifying circuit, and is formed of a plurality of diodes and capacitors connected in a network to boost and rectify the input pulses and thereby provide a high voltage DC output. In the embodiment illustrated, the high voltage DC output of the Cockcroft-Walton circuit 4 is a negative voltage of, for instance, −50 V. The high DC voltage is passed through the low-pass filter 5 to remove the ripple components, and is then applied to the APD 6.

The voltage applied across the APD 6 is varied depending on the voltage drop across the resistor 51 of the low-pass filter 5. The voltage drop across the resistor 51 is proportional to the current I1 which flows through the resistor 51. Since the APD 6 conducts only a small current, most of the current I1 which flows through the resistor 51 is the collector current I2 through transistor 101. The collector current I2 is dependent on or controlled by the signal applied to the base of transistor 101 from the control circuit 103. This means that the voltage applied to the APD 6, and hence the current flowing through the APD 6, can be varied or adjusted by the control circuit 103. Such variation or adjustment is desirable because the APD generally has a wide dynamic range of, say, 40 dB, which is wider than the dynamic range of the amplifier 64. Control circuit 103 may include two resistors 104 and 105 and a potentiometer 106 connected in series as a voltage divider. The potentiometer 106 can be manually adjusted to control the collector current I2 (the resistors 104 and 105 have relatively high values, so the current through control circuit 103 itself is relatively minor), and thus the voltage across APD 6 can be set at its optimum value.

As has been described, according to the above embodiment, the circuit is constructed without employing a MOSFET and a transformer, and consequently the circuit can be small and simple.

When a Cockcroft-Walton circuit is used as the boosting and rectifying circuit, a capacitor is provided at its input, so it is not necessary to provide a separate capacitor for DC isolation from the current driving circuit 2. When a boosting and rectifying circuit is formed of a circuit which itself does not have a capacitor at its input for DC isolation, a separate capacitor must be interposed between the boosting and rectifying circuit and the current driving circuit 2.

As has been described, according to the invention, the pulse oscillating circuit 1 is connected to the current driving circuit 2 for enhancement of the current driving capacity for the boosting and rectifying circuit, and a capacitor is used between the current driving circuit and the boosting and rectifying circuit to eliminate the need for switching elements such as MOSFETs and transformers. It is therefore possible to miniaturize the circuit and the circuit can be simplified, the reliability can be improved, and the cost can be reduced. Use of the Cockcroft-Walton circuit 3 for driving the APD 6 is advantageous in that the Cockcroft-Walton circuit 3 can provide the required high voltage. Although its current capacity is limited the APD 6 does not require a large current. Moreover, by the use of the transistor 101 connected in parallel with the APD 6, together with the control circuit 103, the voltage applied to the APD 6 can be varied or adjusted. Thus, the circuit according to the invention satisfies the requirement with the simplest construction.

What we claim is:

1. A variable high-voltage generating circuit for use with an avalanche photodiode, comprising:
   a pulse oscillating circuit to generate pulses;
   a current driving circuit to current-amplify the pulses;
   a Cockcroft-Walton circuit to receive the current-amplified pulses and to provide a boosted and rectified voltage;
   a low-pass filter connected to the Cockcroft-Walton circuit to remove the ripple components from the boosted and rectified voltage, the low-pass filter having a voltage output node;
   a first resistor connected in series with the avalanche photodiode, the series connection of the first resistor and the avalanche photodiode being connected to the voltage output node of the low-pass filter;
   a transistor;
   a second resistor connected in a series with the transistor, the series connection of the second resistor and the transistor being connected in parallel with the series connection of the first resistor and the avalanche photodiode; and
   a control circuit to apply a variable signal to the base of the transistor.

2. A variable high-voltage generating circuit according to claim 1, wherein the boosted and rectified voltage provided by the Cockcroft-Walton circuit is a negative voltage, wherein the anode of the avalanche photodiode is connected to the voltage output node of the low-pass filter and the cathode of the avalanche photodiode is connected through the first resistor to ground, and wherein the transistor is a PNP transistor, the collector of the transistor being connected to the voltage output node of the low-pass filter and the emitter of the transistor being connected through the second resistor to ground.

3. A variable high-voltage generating circuit according to claim 1, wherein the Cockcroft-Walton circuit has an output node, the boosted and rectified voltage appearing at the output node of the Cockcroft-Walton circuit, and wherein the low-pass filter comprises a resistor connected between the output node of the Cockcroft-Walton circuit and the output node of the low-pass filter, and a capacitor connected between the output node of the low-pass filter and ground.

4. A variable high-voltage generating circuit according to claim 1, wherein the Cockcroft-Walton circuit has first and second portions, the first portion of the Cockcroft-Walton circuit comprising a capacitor which receives the current-amplified pulses from the current driving circuit, the capacitor providing DC isolation between the current driving circuit and the second portion of the Cockcroft-Walton circuit.

5. A variable high-voltage generating circuit according to claim 1, wherein the current driving circuit comprises a plurality of CMOS gate circuits connected in parallel with each other.

* * * * *